United States Patent
Morita et al.

(10) Patent No.: US 11,319,226 B2
(45) Date of Patent: May 3, 2022

(54) CLEANING WATER SUPPLY DEVICE

(71) Applicant: KURITA WATER INDUSTRIES LTD., Tokyo (JP)

(72) Inventors: Hiroshi Morita, Tokyo (JP); Nobuko Gan, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 231 days.

(21) Appl. No.: 16/603,417

(22) PCT Filed: Mar. 20, 2018

(86) PCT No.: PCT/JP2018/011100
§ 371 (c)(1),
(2) Date: Oct. 7, 2019

(87) PCT Pub. No.: WO2018/190089
PCT Pub. Date: Oct. 18, 2018

(65) Prior Publication Data
US 2020/0039854 A1 Feb. 6, 2020

(30) Foreign Application Priority Data
Apr. 14, 2017 (JP) .............................. JP2017-080626

(51) Int. Cl.
*C02F 1/42* (2006.01)
*C02F 1/68* (2006.01)
(Continued)

(52) U.S. Cl.
CPC ................ *C02F 1/685* (2013.01); *C02F 1/42* (2013.01); *C02F 1/4695* (2013.01); *C02F 1/66* (2013.01);
(Continued)

(58) Field of Classification Search
CPC .. C02F 1/20; C02F 1/42; C02F 1/4695; C02F 1/50; C02F 1/58; C02F 1/66; C02F 1/685;
(Continued)

(56) References Cited

U.S. PATENT DOCUMENTS 7,329,312 B2 2/2008 Morita et al.
8,916,048 B2 12/2014 Arai et al.
(Continued)

FOREIGN PATENT DOCUMENTS

JP H11-181493 A 7/1999
JP 2000-037695 A 2/2000
(Continued)

OTHER PUBLICATIONS

Machine Translation of JP 2000-037695 to Osawa et al. (2000) (obtained from Google Patents Jul. 2021) (Year: 2000).*
(Continued)

*Primary Examiner* — Chester T Barry
(74) *Attorney, Agent, or Firm* — Manabu Kanesaka

(57) ABSTRACT

A cleaning water supply device includes an ultrapure water line through which ultrapure water flows by a fixed amount, a production unit that produces cleaning water by adding a solute to the ultrapure water line by a fixed amount, a cleaning water line for causing the cleaning water to flow, cleaning machines to which the cleaning water is supplied from the cleaning water line, a solute removal unit into which excess cleaning water is introduced from the cleaning water line, and a collecting line for returning collected water from which the solute is removed to a tank and the like.

11 Claims, 3 Drawing Sheets

(51) Int. Cl.
| | |
|---|---|
| *C02F 1/469* | (2006.01) |
| *C02F 1/66* | (2006.01) |
| *H01L 21/67* | (2006.01) |
| *C02F 103/04* | (2006.01) |
| *C02F 103/34* | (2006.01) |

(52) U.S. Cl.
CPC .... *H01L 21/67051* (2013.01); *C02F 2103/04* (2013.01); *C02F 2103/346* (2013.01); *C02F 2209/04* (2013.01); *C02F 2209/06* (2013.01); *C02F 2303/18* (2013.01)

(58) Field of Classification Search
CPC .... C02F 1/70; C02F 1/72; C02F 1/722; C02F 9/00; C02F 2103/04; C02F 2103/346; C02F 2303/18; H01L 21/02052; H01L 21/304; H01L 21/67017; H01L 21/67028; H01L 21/67051
See application file for complete search history.

(56) References Cited

U.S. PATENT DOCUMENTS

| | | | |
|---|---|---|---|
| 10,406,493 | B2 | 9/2019 | Hayashi et al. |
| 2003/0106855 | A1* | 6/2003 | Kin .................... C02F 1/78 210/748.15 |
| 2009/0127201 | A1 | 5/2009 | Kobayashi |
| 2016/0361693 | A1 | 12/2016 | Hayashi et al. |
| 2020/0039854 | A1 | 2/2020 | Morita et al. |

FOREIGN PATENT DOCUMENTS

| | | | |
|---|---|---|---|
| JP | 2003-340458 | A | 12/2003 |
| JP | 2007-185587 | A | 7/2007 |
| JP | 2008-205490 | A | 9/2008 |
| JP | 2011-245380 | A | 12/2011 |
| JP | 5329463 | B2 | 10/2013 |
| JP | 2015-088740 | A | 5/2015 |
| JP | 2015-155083 | A | 8/2015 |
| JP | 2016-139766 | A | 8/2016 |
| JP | 6477771 | B2 | 3/2019 |
| TW | 200306886 | A | 12/2003 |
| TW | 201202153 | A | 1/2012 |
| WO | 2016/042933 | A1 | 3/2016 |

OTHER PUBLICATIONS

Taiwan Patent Office, "Office Action for Taiwanese Patent Application No. 107110606," dated Mar. 8, 2021.
Korea Patent Office, "Office Action for Korean Patent Application No. 10-2019-7025529," dated Apr. 13, 2021.
Japan Patent Office, "Reason for Opposition for Japanese Patent No. 6477771," dated Sep. 6, 2019.
"The Science of Ultrapure Water (超純水の科学)," Semiconductor Fundamental Technology Study Group (半導体基盤 技術研究会 編), Surface Science Technology, Sep. 11, 1990, p. 152-157, Realize Inc.
Japan Patent Office, "Cancellation Reason Notification for Japanese Patent Application No. 2019-700711," dated Nov. 29, 2019.
PCT/ISA/210, "International Search Report for International Application No. PCT/JP2018/011100," dated Jun. 19, 2018.
Japan Patent Office, "Notice of Reasons for Refusal for Japanese Patent Application No. 2017-080626," dated Jun. 6, 2018.
Korea Patent Office, "Office Action for Korean Patent Application No. 10-2019-7025529," dated Aug. 4, 2021.

* cited by examiner

CLEANING WATER SUPPLY DEVICE

TECHNICAL FIELD

The present invention relates to a device that produces cleaning water for a semiconductor wafer and the like by adding a pH adjuster, an oxidation-reduction potential adjuster, and the like to ultrapure water, and supplies the cleaning water, and more particularly to a device suitable for producing and supplying wafer cleaning water containing solutes such as the pH adjuster and the oxidation-reduction potential adjuster at an extremely low concentration.

BACKGROUND ART

In a cleaning/rinse water process for a semiconductor wafer, in order to suppress the electrification, metal corrosion and melting, and fine particle adhesion of the wafer, a water quality adjustment water obtained by dissolving an acidic or alkaline pH adjuster or an oxidation-reduction potential adjuster such as an oxidizing agent or a reducing agent in ultrapure water at a minimum necessary concentration that is extremely low may be used as cleaning water (including rinse water) (for example, see PTL 1). As a method for producing the cleaning water, there is a method of dissolving reducible, oxidized, acid, or alkaline gas such as $H_2$, $O_3$, $CO_2$, and $NH_3$ in the ultrapure water. However, a method of injecting a chemical solution obtained by dissolving the pH adjuster and/or the oxidation-reduction potential adjuster in water is often employed due to the simplicity of the operation. Methods for injecting the chemical solution include a method using a pump, and a method using pressurization by inert gas such as $N_2$ and a closed container, and those methods are put in practical use.

When the flow rate of the ultrapure water is constant, it is easy to add the solute so as to obtain a desired concentration. However, in a cleaning machine in which dilute cleaning water is actually used, the supplying and suspension of the water poured onto the wafer is controlled by the opening and closing of a plurality of valves, and the flow rate fluctuates on an irregular basis.

In order to cause the solute concentration of the dilute cleaning water to fall within a desired range even when the ultrapure water flow fluctuates, solute adding control is performed by various methods such as proportional control with respect to the flow rate of the ultrapure water and PID control performed by receiving signals from a concentration monitor. However, especially in a single-wafer cleaning machine including a plurality of cleaning chambers, solute adding control that can sufficiently follow irregular fluctuation in the flow rate is not achieved. As a result, there have been times when the liquid quality of the cleaning water or the rinse water poured onto the wafer greatly deviates from a target value.

There are simple methods in which the liquid quality stabilization is prioritized and the dilute cleaning water is continuedly produced and supplied under fixed conditions. However, in this case, excess water directly flows out. In recent multi-chamber single-wafer cleaning machines, the difference between the maximum flow rate and the minimum flow rate that are momentarily needed is large. When the cleaning water is continuously supplied by the maximum flow rate or more, a corresponding amount of excess water is discharged, which causes a problem in terms of the load on facilities for service water and drainage water, excess usage and discharge of the chemical solution.

PTL 1: JP 2016-139766 A

SUMMARY OF INVENTION

An object of the present invention is to provide a cleaning water supply device capable of stably supplying cleaning water, which contains solutes such as alkali and an oxidizing agent at an extremely low concentration and is suitable to be supplied in a cleaning/rinsing process for a semiconductor wafer and the like.

The cleaning water supply device of the present invention includes: an ultrapure water line; a cleaning water production unit that produces cleaning water at a certain concentration by adding a pH adjuster and/or an oxidation-reduction potential adjuster to ultrapure water from the ultrapure water line; a cleaning water line that performs supplying cleaning water to a cleaning machine from the cleaning water production unit; and a removal unit that removes a solute from excess cleaning water from the cleaning water line.

In one aspect of the present invention, the cleaning water production unit includes means for supplying the ultrapure water to the ultrapure water line by a fixed amount, and means for supplying the solute to the ultrapure water by a fixed amount.

In one aspect of the present invention, a plurality of cleaning machines are connected to the cleaning water line, and the cleaning water production unit is able to produce the cleaning water by an amount that is larger than a total of maximum usage amount of all of the cleaning machines.

In one aspect of the present invention, the removal unit includes an ion exchange resin, an electric regeneration-type ion exchange device, or a platinum nano colloid supported resin.

ADVANTAGEOUS EFFECTS OF INVENTION

In the present invention, in the cleaning water production unit, the cleaning water that has reached a certain concentration with high accuracy is produced by adding a fixed amount of solute to the ultrapure water flowing at a constant flow rate. The cleaning water at a certain concentration is supplied to the wafer cleaning machine, the solute in the excess cleaning water is removed in the solute removal unit, and the ultrapure water is collected. The solute in the excess cleaning water and the concentration thereof are known, and there are few types of solute components. Therefore, the solute can be easily and sufficiently removed from the excess cleaning water.

According to the present invention, in a multi-chamber single-wafer cleaning machine in which a large number of valves open and close on an irregular basis, the supplying in which the extremely important liquid quality is accurately and stably maintained at a desired value can be achieved in the cleaning/rinsing process, and the ultrapure water can be prevented from being wasted by eliminating the discharge of excess water.

DESCRIPTION OF EMBODIMENT

The present invention is described in detail below with reference to the drawings.

Figure 1:
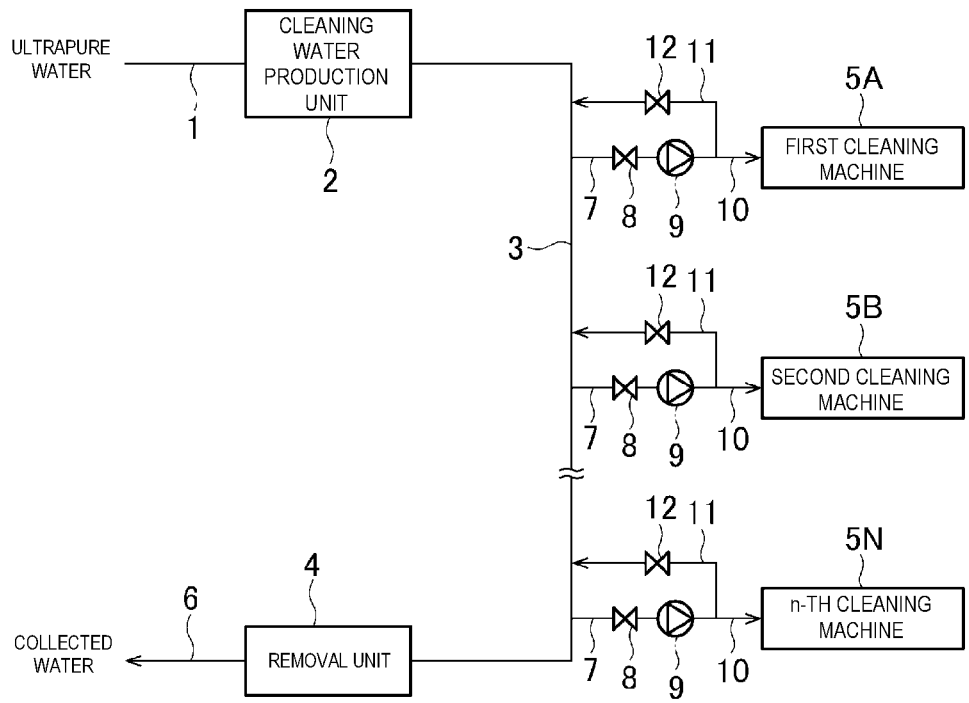
FIG. 1 is a system diagram illustrating an example of an embodiment of a cleaning water supply device of the present invention.

FIG. 1 is a system diagram illustrating an example of an embodiment of a cleaning water supply device of the present invention.

The cleaning water supply device is for producing water quality adjustment water by adding a pH adjuster, an oxidation-reduction potential adjuster, and/or the like to ultrapure water, and supplying the water quality adjustment water to a cleaning machine, and includes a ultrapure water line 1 through which ultrapure water flows by a fixed amount, a production unit 2 that produces cleaning water by adding a solute to the ultrapure water line by a fixed amount, a cleaning water line 3 for causing the cleaning water to flow, a number of n first to n-th cleaning machines 5A, 5B, ... and 5N to which the cleaning water is supplied from the cleaning water line 3, a solute removal unit 4 to which excess cleaning water is introduced from the cleaning water line 3, a collecting line 6 for returning the collected water from which the solute is removed to a tank, and the like.

The cleaning water is supplied to the cleaning machines 5A and 5B to 5N from the cleaning water line 3 via branching piping 7, a valve 8, a pump 9, and piping 10. A filter may be provided in the piping 10. Return piping 11 branches off from the piping 10, and the terminal side of the return piping 11 is connected to the cleaning water line 3. A valve 12 is provided in the return piping 11.

In the ultrapure water line 1, the ultrapure water flows at a constant flow rate by a fixed amount supply device including a metering pump, a constant flow rate valve, a flow rate control device, and the like. In the production unit 2, the solute is added to the ultrapure water by a constant supply amount. As a result, cleaning water that has reached a target concentration with high accuracy is supplied toward the cleaning machines 5A to 5N via the cleaning water line 3.

An example of the configuration of the cleaning water production unit 2 is illustrated in FIGS. 2 to 6.

Figure 2:
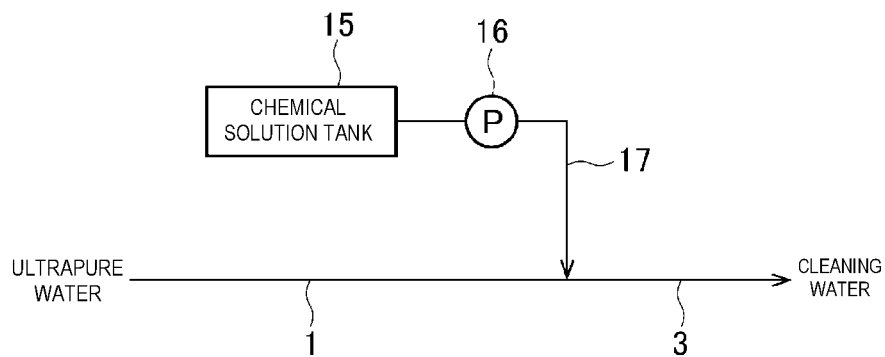
FIG. 2 is a configuration diagram of a cleaning water production unit.

In FIG. 2, the cleaning water production unit is formed by a chemical solution tank 15, a chemical injection pump 16, and a chemical injection piping 17. In the chemical solution tank 15, a chemical solution in which one or more types of a pH adjuster, an oxidation-reduction potential adjuster, and the like are dissolved at a predetermined concentration is stored. As the chemical injection pump 16, a metering pump or a pump with a flow rate control device is used. Two or more chemical injection units each formed by the chemical solution tank 15, the chemical injection pump 16, and the chemical injection piping 17 may be installed.

Figure 3:
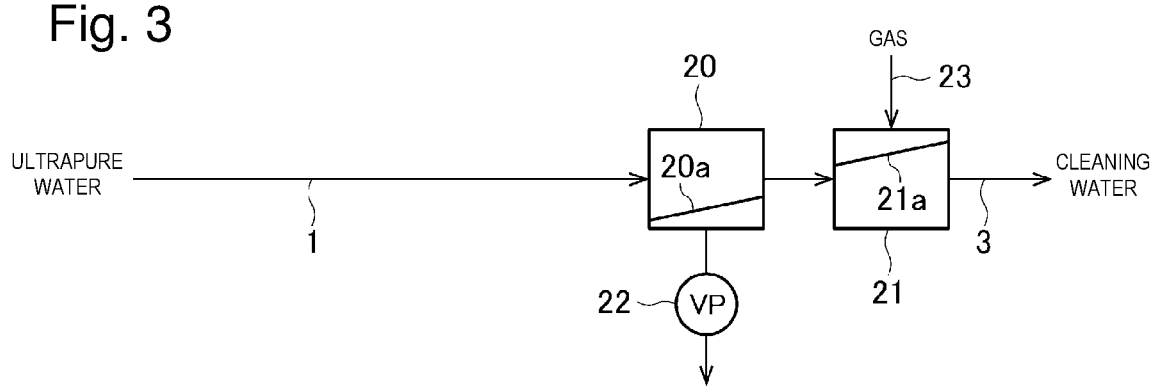
FIG. 3 is a configuration diagram of the cleaning water production unit.

In FIG. 3, the cleaning water production unit includes a deaeration device 20 for removing gas components such as oxygen, and a membrane-type gas dissolving device 21. In this embodiment, the deaeration device 20 is a membrane-type deaeration device including a membrane 20a, and is formed so as to decompress the inside of a gas phase chamber separated by the membrane 20a by decompression means such as a vacuum pump 22. However, the deaeration device may be a device other than the membrane deaeration device.

The gas dissolving device 21 is a membrane-type dissolving device in this embodiment. A fixed amount of gas to be dissolved in the ultrapure water is supplied to the inside of the gas phase chamber separated by a gas permeable membrane 21a via piping 23.

The gas supplied to the gas dissolving device 21 from the piping 23 contains one type or two or more types of dissolution target component gas. It is possible for the gas supplied to the gas dissolving device 21 to contain only one type or two or more types of target component gas, and the gas supplied to the gas dissolving device 21 may be mixed gas with a fixed amount ratio of the target component gas and the inert gas.

Note that a direct gas-liquid contact-type gas dissolving device such as an ejector may be used other than the membrane-type gas dissolving device.

Figure 4:
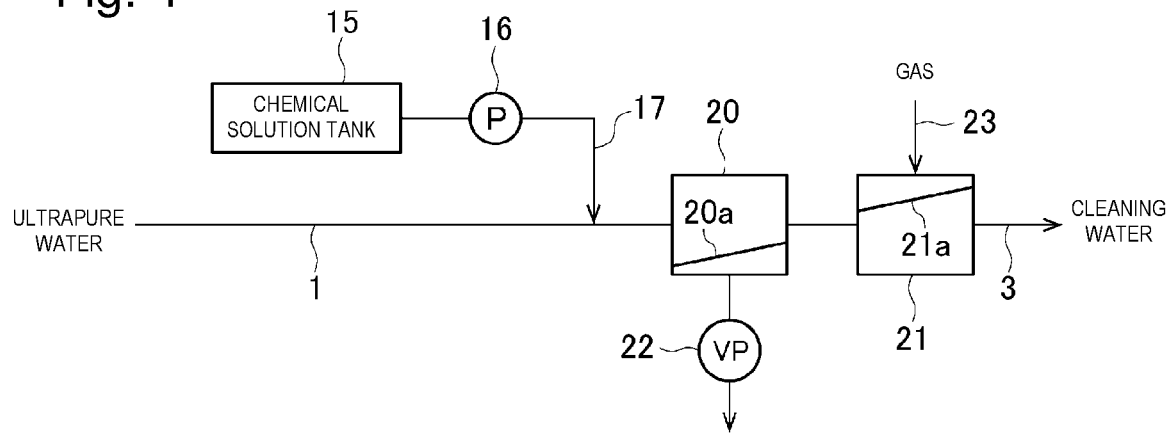
FIG. 4 is a configuration diagram of the cleaning water production unit.

The cleaning water production unit in FIG. 4 includes both of the chemical solution tank 15, the chemical injection pump 16, and the chemical injection piping 17 in FIG. 2, and the deaeration device 20 and the gas dissolving device 12 in FIG. 3.

Figure 5:
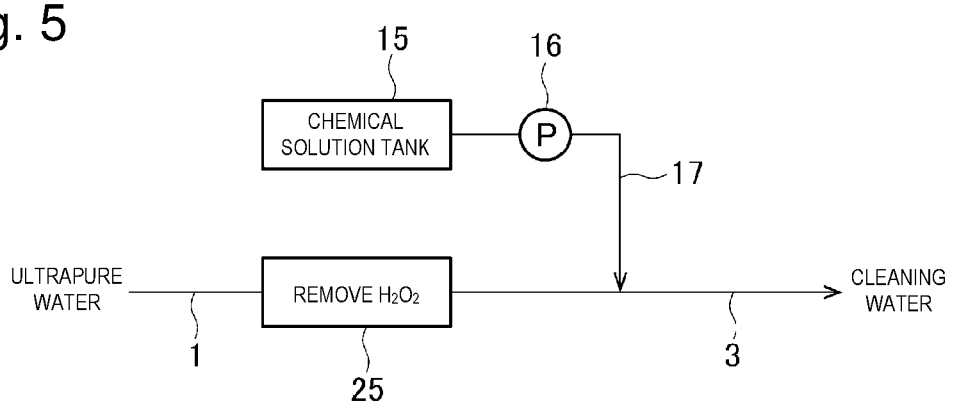
FIG. 5 is a configuration diagram of the cleaning water production unit.

The cleaning water production unit in FIG. 5 is obtained by providing a hydrogen peroxide removal device 25 in the ultrapure water line 1 in FIG. 2, and other configurations are the same as FIG. 2. By installing the hydrogen peroxide removal device 25, the amount of the oxidizing agent in the cleaning water can be accurately controlled.

Figure 6:
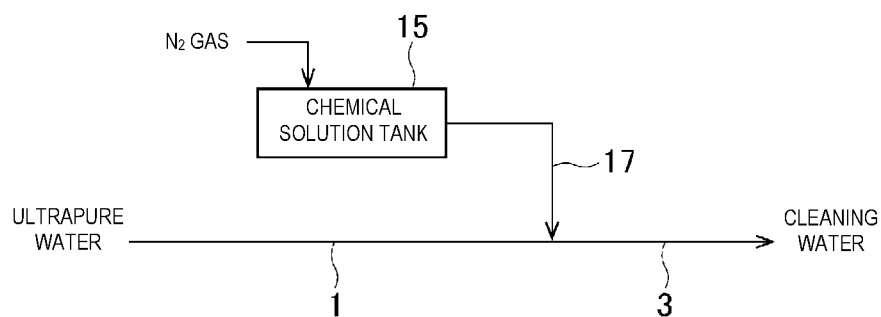
FIG. 6 is a configuration diagram of the cleaning water production unit.

In FIGS. 2, 4, and 5, the chemical solution in the chemical solution tank 15 is injected into the ultrapure water line 1 by the chemical injection pump 16. However, the chemical solution may be added to the ultrapure water line 1 by a fixed amount by supplying a fixed amount of inert gas such as nitrogen gas to the chemical solution tank 15 as in FIG. 6. FIG. 6 relates to FIG. 2, but FIGS. 4 and 5 may also be configured in a similar manner.

The cleaning water amount supplied to the cleaning water line 3 from the production unit 2 is larger than the total amount of the maximum amount of the cleaning water amount supplied to the cleaning machines 5A to 5N, and is preferred to be 120% or more of the total amount.

In the present invention, the chemical solution injected in the ultrapure water is a chemical solution prepared by dissolving the pH adjuster and/or the oxidation-reduction potential adjuster in the ultrapure water. As the pH adjuster, hydrochloric acid, acetic acid, nitric acid, phosphoric acid, sulfuric acid, hydrofluoric acid, ammonia, sodium hydroxide, potassium hydroxide, tetramethylammonium hydroxide, ammonium carbonate, or the like can be used.

As the oxidation-reduction potential adjuster, hydrogen peroxide or nitric acid can be used.

The chemical solution used in the present invention generally contains those chemical agents at a concentration of from about 20 weight percent to about 48 weight percent, and cleaning water with a chemical agent concentration of from about 0.1 mg/L to about 100 mg/L is generally produced by injecting the chemical solution as above into the ultrapure water.

As the gas to be dissolved in the ultrapure water, $H_2$, $O_3$, $CO_2$, $NH_3$, and the like are exemplified. The concentration of the gas above is also usually a dilute concentration in the order of ppm, for example, 50 ppm or less, and particularly 20 ppm or less.

As described above, in the present invention, the chemical injection mechanism or the gas dissolving mechanism of the related art can be directly applied to the dissolution of acid, alkali, an oxidizing agent, a reducing agent, and the like in the production unit 2. In other words, dissolution is performed so as to obtain a desired solute concentration by performing pressure feeding by a pump or inert gas such as $N_2$ for the case of chemical injection, and by performing gas-liquid contact operation by a gas permeable membrane module, an ejector, and the like for the case of gas dissolution.

It is possible to handle the treatment of the excess water in the removal unit 4 with only an ion exchange resin or a platinum group catalyst. In other words, acid and alkali in the order of ppm can be easily removed by an ion exchange device. An electric regeneration-type ion exchange device (so-called EDI) can be applied. Catalysts such as a platinum nano colloid supported resin are effective for the removal of the oxidizing agent and the reducing agent. When there is excess water containing a large amount of ozone, a catalyst suitable for ozone destruction is desired to be added.

The solute concentration in the excess cleaning water from the cleaning water line 3 is in the order of ppm, which is extremely low, and the type of the solute is limited. Therefore, it is easy to sufficiently remove the solute, and the purity returns to a purity close to the ultrapure water by a simple combination of an ion exchange device and a catalyst device. Therefore, the collected water of which solute is removed in the removal unit 4 can be guided to the return piping for excess ultrapure water and the ultrapure water tank, and reuse without waste is possible.

Figure 7:
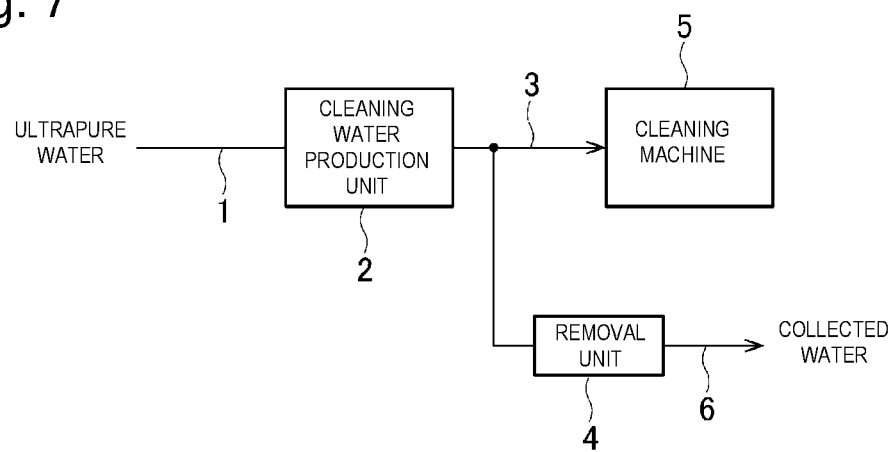
FIG. 7 is a system diagram illustrating an example of the embodiment of the cleaning water supply device of the present invention.

The embodiment described above is an example of the present invention, and the present invention may be a form other than those described above. In the embodiment described above, a plurality of (a number of N) cleaning machines 5A to 5N are installed, but it is possible to install only one cleaning machine as in FIG. 7.

The present invention has been described in detail with predetermined aspects, but it would be clear to a person skilled in the art that various changes can be made without departing from the intent and the scope of the present invention.

This application is based on Japanese Patent Application No. 2017-080626 filed on Apr. 14, 2017, the entirety of which is incorporated herein by reference.

REFERENCE SIGNS LIST

1 Ultrapure water line
2 Cleaning water production unit
3 Cleaning water line
4 Removal unit
5, 5A to 5N Cleaning machine
15 Chemical solution tank
16 Chemical injection pump
20 Deaeration device
21 Gas dissolving device

The invention claimed is:

1. A cleaning water supply device, comprising:
an ultrapure water line;
a cleaning water production unit that produces cleaning water at a certain concentration by adding a pH adjuster and/or an oxidation-reduction potential adjuster to ultrapure water from the ultrapure water line;
a cleaning water line that performs supplying cleaning water to a cleaning machine from the cleaning water production unit; and
a removal unit that removes a solute from excess cleaning water from the cleaning water line, the removal unit including an ion exchange resin and/or a platinum group catalyst.

2. The cleaning water supply device according to claim 1, wherein the cleaning water production unit comprises means for supplying the ultrapure water to the ultrapure water line by a fixed amount, and means for supplying the solute to the ultrapure water by a fixed amount.

3. The cleaning water supply device according to claim 2, wherein:
the cleaning machine is a multi-chamber single-water cleaning machine in which a large number of valves open and close on an irregular basis, including a plurality of individual cleaning machines each being connected to the cleaning water line; and
the cleaning water production unit produces the cleaning water by an amount that is larger than a total of maximum usage amount of all of the cleaning machines.

4. The cleaning water supply device according to claim 1, wherein the removal unit comprises an ion exchange resin, an electric regeneration-type ion exchange device, or a platinum nano colloid supported resin.

5. The cleaning water supply device according to claim 3, wherein an amount of the cleaning water supplied from the cleaning water production unit to the cleaning water line is 120% or more relative to a total of maximum usage amount of all of the individual cleaning machines.

6. The cleaning water supply device according to claim 5, further comprising a plurality of branching pipes each being connected to the cleaning water line, a plurality of another pipes each being connected to each of the plurality of individual cleaning machines, a plurality of pumps and valves, one pump and one valve being interposed between one of the branching pipes and one of the another pipes, and a plurality of returning pipes each being connected between one of the another pipes and the cleaning water line through another valve, so that one or more individual cleaning machines required is only operated.

7. The cleaning water supply device according to claim 6, wherein the removal unit includes the ion exchange resin and the platinum group catalyst.

8. The cleaning water supply device according to claim 7, wherein the cleaning water production unit comprises a chemical solution tank, a chemical injection pump and a chemical injection pipe through which chemical in the chemical solution tank is supplied to the cleaning water line.

9. The cleaning water supply device according to claim 7, wherein the cleaning water production unit includes a deaeration device for removing gas components, and a gas dissolving device provided in the cleaning water line.

10. The cleaning water supply device according to claim 8, further comprising a hydrogen peroxide removal device provided in the cleaning water line, the chemical being added after the hydrogen peroxide removal device.

11. The cleaning water supply device according to claim 8, wherein an inert gas is supplied to the chemical solution tank.

* * * * *